US008204467B2

(12) United States Patent
Tillman et al.

(10) Patent No.: US 8,204,467 B2
(45) Date of Patent: Jun. 19, 2012

(54) PASSIVE MIXER MISMATCH TUNING USING SELF-TESTS TO SUPPRESS IM2

(75) Inventors: Fredrik Tillman, Lund (SE); Fenghao Mu, Hjärup (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 413 days.

(21) Appl. No.: 12/368,785

(22) Filed: Feb. 10, 2009

(65) Prior Publication Data

US 2010/0203860 A1 Aug. 12, 2010

(51) Int. Cl.
*H04B 1/26* (2006.01)
(52) U.S. Cl. ............ 455/323; 455/333; 327/355
(58) Field of Classification Search ............ 455/323, 455/333, 326; 327/355, 359
See application file for complete search history.

(56) References Cited

U.S. PATENT DOCUMENTS

| 7,259,569 | B2 * | 8/2007 | Kim .................. 324/601 |
| 7,421,263 | B2 | 9/2008 | Kim |
| 7,929,938 | B2 * | 4/2011 | Sellars et al. .......... 455/333 |
| 2003/0216128 | A1 * | 11/2003 | Zhou .................. 455/127.1 |
| 2004/0242178 | A1 * | 12/2004 | Kim et al. .......... 455/234.1 |
| 2006/0068746 | A1 | 3/2006 | Feng et al. |
| 2007/0019113 | A1 * | 1/2007 | Van Sinderen et al. ....... 348/648 |
| 2007/0066269 | A1 | 3/2007 | Kivekas et al. |
| 2007/0132500 | A1 | 6/2007 | Embabi et al. |
| 2007/0135075 | A1 | 6/2007 | Chiu et al. |
| 2008/0116902 | A1 | 5/2008 | Kim et al. |
| 2008/0139164 | A1 | 6/2008 | Barre |
| 2008/0280584 | A1 * | 11/2008 | Ko et al. ............ 455/333 |
| 2009/0111420 | A1 * | 4/2009 | Tasic et al. .......... 455/334 |

FOREIGN PATENT DOCUMENTS

WO   WO 2007/113733 A2   10/2007

OTHER PUBLICATIONS

Rodriguez, S., et al., "A Novel BiST and Calibration Technique for CMOS Down-Converters." 4th IEEE International Conference on Circuits and Systems for Communications, May 26-28, 2008 (ICCSC 2008), pp. 828-832. IEEE, Piscataway, NJ.

* cited by examiner

*Primary Examiner* — Quan Tra
(74) *Attorney, Agent, or Firm* — Coats & Bennett, P.L.L.C.

(57) ABSTRACT

The second-order inter-modulation distortion, originating in a differential passive mixer core from imbalance between devices, is reduced by compensating for the mismatch or load, by means of tuning the differential output impedance at the mixer core, or the input impedance of a filter coupled to the output of the passive mixer. Compensating for the imbalance allows greater suppression of even-order harmonics in the differential structure, which reduces second-order inter-modulation at the output of the mixers. The compensation is achieved by tunable resistive elements that are calibrated by a built-in self-test architecture. The calibration circuit is deactivated during receiver operation.

17 Claims, 9 Drawing Sheets

US 8,204,467 B2

PASSIVE MIXER MISMATCH TUNING USING SELF-TESTS TO SUPPRESS IM2

TECHNICAL AREA

The present invention relates generally to RF mixers, and in particular to a system, method, and calibration circuit for reducing second-order inter-modulation distortion, originating from imbalance between devices, in a differential passive mixer.

BACKGROUND

A basic building block of a radio frequency (RF) communication receiver is the mixer. A mixer down-converts an RF signal received at an antenna to an intermediate frequency (IF)—or in some receiver designs, directly down-converts the received RF signal into a zero intermediate frequency (ZIF)—by multiplying the received signal with a local oscillator (LO) signal. A receiver using ZIF is also called homodyne or "direct conversion" receiver. A direct conversion receiver is easier to integrate on a chip than IF designs, as it eliminates pass-band filters and reduces the space and complexity as well as cost.

A typical prior art receiver architecture 140 is depicted in FIG. 11. A received RF signal is amplified by a low noise amplifier (LNA) 142. A Balun 144 transforms the received signal to one balanced about ground. In-phase (I) and quadrature (Q) mixers 146 down-convert the balanced RF signals to baseband by mixing the I and Q components, respectively, with clock signals having a 90-degree phase offset, from a local oscillator or clock generator/driver 148. The baseband signals are then filtered by baseband low pass filters 150 to remove high frequency harmonics.

Mixers 146 in practice may be designed as either active or passive circuits. Active mixers can provide gain while down-converting the RF signal, but are generally less linear and have higher noise figures. In particular, the flicker noise contribution is higher, which is harmful for narrow-band RF applications like GSM.

RF communication systems usually demand a duplex operation mode in a transceiver, in which the receiver 140 and a transmitter work simultaneously. As the transmitter sends signals at high power levels, the receiver 140 will suffer from interference. As a result, very good linearity is required for both the LNA 142 and the mixer(s) 146. This is particularly true for the mixer 146, as the RF signal is amplified by the LNA 142. For a direct conversion receiver 140, protecting the receiver 140 from the interference created by a transmitter is very important. In particular, the second order inter-modulation product, IM2, must be kept low. The measure of this is known as the second order input intercept point (IIP2).

In order to obtain better IIP2, it is known to process differential RF signals in a balanced, or symmetric topology, to cancel out nonlinearities caused by the devices (e.g., transistors). Thus, a balun 144 is employed to perform single-end to differential conversion of the input RF signal. Ideally, the even orders of nonlinear distortions of differential signals could be cancelled between balanced positive and negative output nodes. This requires a perfect match between the transistors used in mixer cores 146 as well as the clock drivers 148. In practice, any mismatch of transistors in mixer cores 146 and/or the clock drivers 148 will lead to limited suppression of IM2.

One known approach to reducing the over-all component mismatch is to decrease the device spread by scaling up the device sizes. However, this approach has the disadvantage of consuming larger chip area, and more seriously also results in larger power consumption due to increased capacitive loading.

For quadrature mixer operation, as shown in FIG. 11, a two-phase clock scheme does not work well, since the two output loads will interact with each other, resulting in lower conversion gain, lower linearity, and IQ leakage. Therefore, good isolation between the I and Q channels is required. One known remedy is to use a four-phase clock scheme, wherein four conducting time slots are non-overlapped and evenly spaced between I and Q without short-circuiting the two loads.

SUMMARY

According to embodiments of the present invention, the second-order inter-modulation distortion, originating from imbalance between devices, is reduced by compensating for the mismatch in a differential passive mixer core or load, by means of tuning the differential output impedance at the mixer core, or the input impedance of a filter. Compensating for the imbalance allows greater suppression of even-order harmonics in the differential structure, which reduces second-order intermodulation at the output of the mixers. The compensation is achieved by tunable resistive elements that are calibrated by a built-in self-test architecture. The calibration circuit is deactivated during receiver operation.

One embodiment relates to a method of reducing second order intermodulation in a differential passive mixer having a signal source, a mixer core including differentially-connected transistors, and a load, wherein the transistors are driven during a calibration mode by a clock driver. One or more tunable resistive elements are provided in the mixer core or load. The resistance of one or more tunable resistive elements is adjusted in a calibration procedure to compensate for mismatches between transistors in the differential mixer or clock driver.

Another embodiment relates to a calibration circuit for reducing second order intermodulation in a differential passive mixer. The circuit includes a signal source and one or more mixer cores, each including differentially-connected transistors and tunable resistive elements. The circuit also includes a first switching matrix operative to selectively couple a mixer core to a measuring circuit, and a second switching matrix operative to selectively couple outputs of a selected mixer core to the measuring circuit. The circuit further includes a measuring circuit having two inputs, and operative to detect and quantify a current mismatch in signals coupled to the inputs.

DETAILED DESCRIPTION

Figure 1:
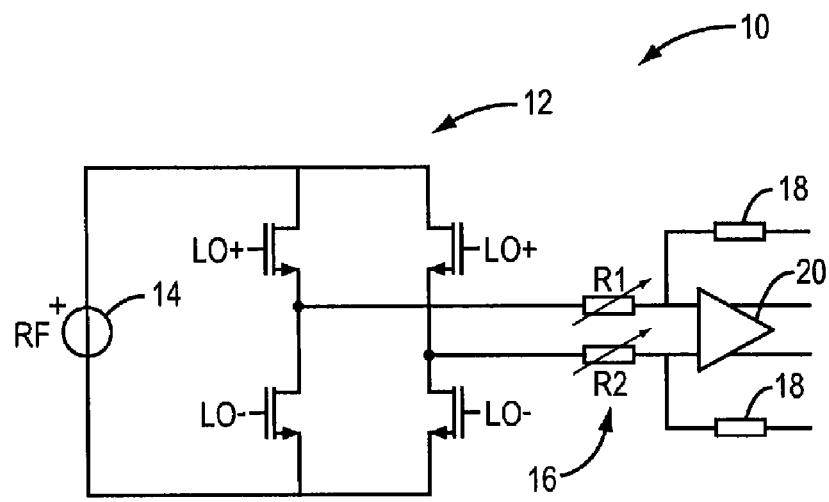
FIG. 1 is a schematic diagram of a differential passive mixer core with variable resistive elements in the load.

Embodiments of the present invention use compensation techniques to calibrate the device mismatch present in the mixer cores and clock drivers. FIG. 1 depicts a receiver circuit 10 including an RF source 14, a passive mixer core 12 constructed from differentially-connected NMOS transistors, tunable resistor elements 16, the outputs of the mixer core 12 are connected to load resistances 18 and an amplifier 20. The inputs of the amplifier 20 represent a virtual ground node. In this embodiment, mismatches in the core 12 transistors, and/or transistors in a clock driver (not shown), give rise to an unbalanced output that fails to fully suppress even orders of nonlinear distortions in the output, giving rise to a second-order inter-modulation product.

These mismatches in the core 12 may be offset by adjusting the differential output load—deliberately creating an imbalance which will compensate for the mixer core 12 imbalance. This load imbalance is achieved by adjusting the tunable resistor elements 16 in the load. By changing the values of R1 and/or R2, the original balance between R1 and R2 can be changed. However, it is essential to realize that the mismatch in the mixer core 12 is very small, mainly determined by the process technology used for integration and device sizes. Hence the tuning of the resistor elements 16 will also be very small.

Figure 2:
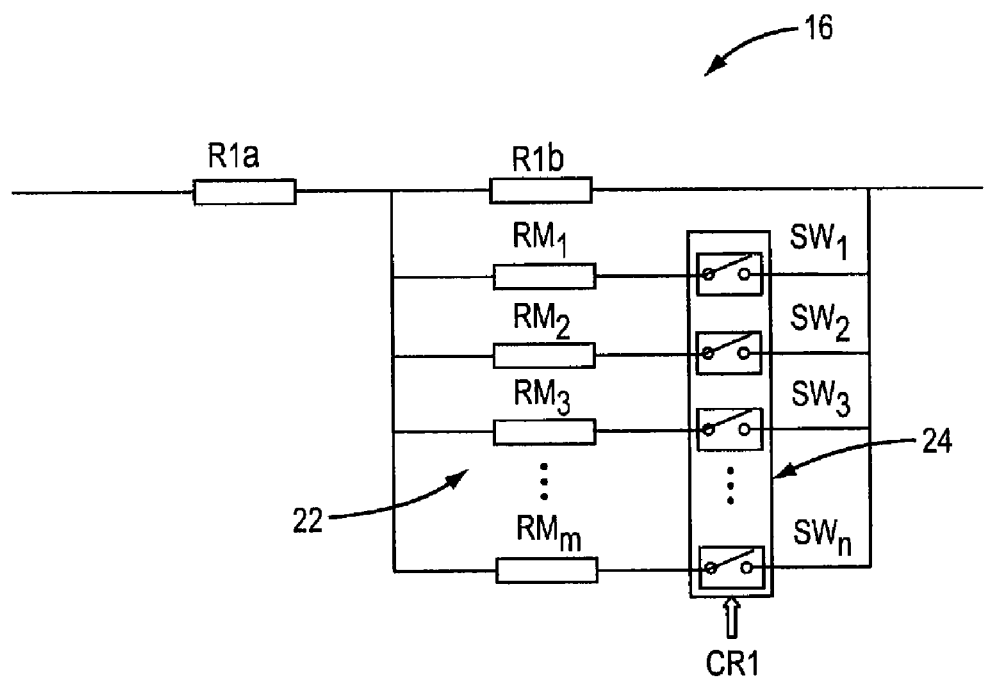
FIG. 2 is a schematic diagram of one embodiment of a variable resistive element.

One way to implement the tunable resistor elements 16 is depicted in FIG. 2. A plurality of large resistors 22 are selectively connected in parallel with a nominal resistor R1b by an array of switches 24. The value of the resistor element 16 is R1=R1a+R1b. If Rb<<R1a, tuning of R1b by means of connecting large RM resistances 22 in parallel will make fine tuning of R1 possible. Of course, other means of varying the value of a tunable resistor element 16 are known, and may be applied.

Note that the nominal resistor 16 of FIG. 2 can only be tuned in one direction, which is why both R1 and R2 must be tunable, in the embodiment of FIG. 1. However, by using other tunable resistor elements 16, in which the resistance value can be tuned in both directions, only one resistor of R1 and R2 needs to be tunable.

The RF source 14 may comprise a differential balun and an LNA which receives the input RF signal from an antenna and amplifies it at the LNA output connected to the balun. The desired DC value of the RF common-mode can easily be set by means of a center tap, and will also be the DC voltage present at the virtual ground, since no DC current is present in the passive mixer core 12.

Figure 3:
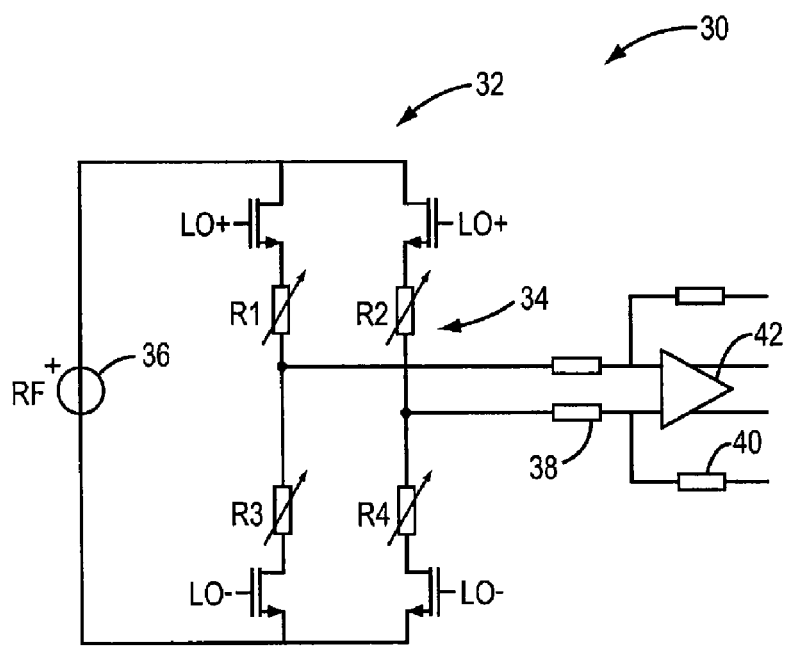
FIG. 3 is a schematic diagram of differential passive mixer core with variable resistive elements in the core.

In another embodiment, load tuning is achieved by including the tunable resistor elements within the mixer core and keeping the mixer load constant. FIG. 3 depicts a receiver 30 comprising an RF source 36, a differential passive mixer core 32 having tunable resistor elements 34 in the core 32, constant load resistances 38 and 40 and an amplifier 42 which inputs become a virtual ground node. In this embodiment, mismatches between the mixer core 32 transistors (and or clock driver transistors, not shown) that would deviate from a balanced output and create second-order inter-modulation distortion, are compensated by adjusting the tunable resistor elements 34 in the core 32.

Figure 4:
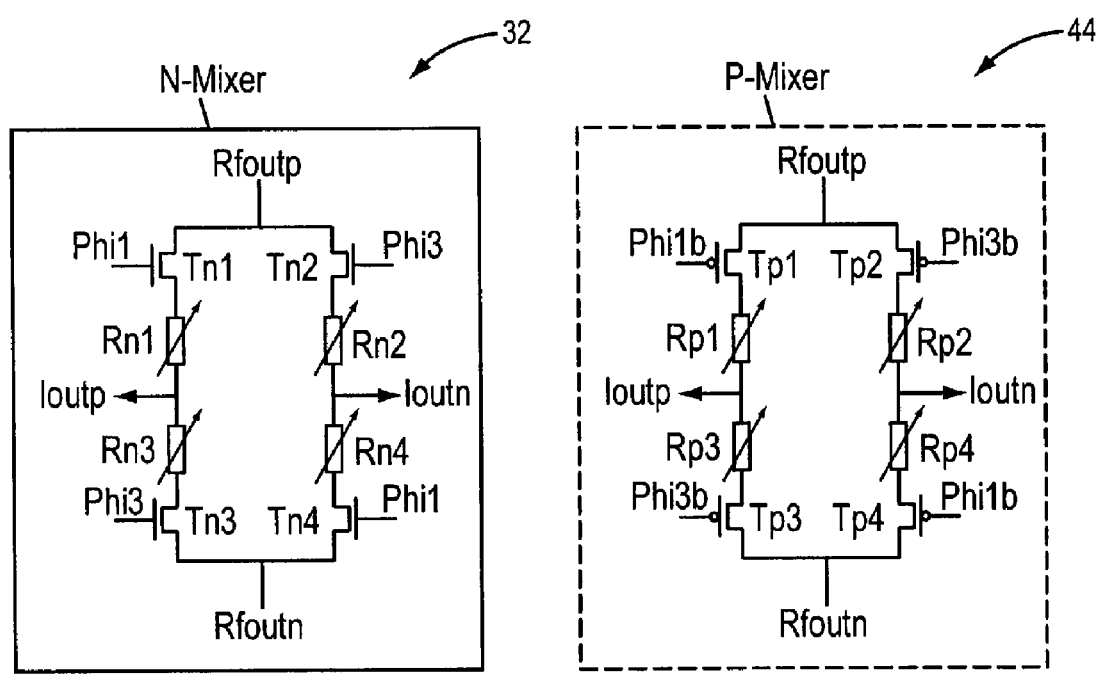
FIG. 4 is a schematic diagram of complimentary differential passive mixer cores with variable resistive elements in the cores.

For low supply voltage applications, a complementary mixer (including both an NMOS mixer and a PMOS mixer), provides better linearity than a stand-alone NMOS mixer. FIG. 4 depicts a complementary mixer comprising the differential passive NMOS mixer core 32 of FIG. 3, together with a differential passive PMOS mixer core 44. Both cores 32, 44 include tunable resistor elements 34 to compensate for device mismatches and balance the output to suppress second-order inter-modulation distortion.

In practice, for the embodiments of FIG. 1, 3, or 4 to achieve a balanced output and suppress even-order harmonics, the tunable resistor elements 16, 34 must be calibrated against the specific transistors in the respective mixer cores 12, 32, 44 (or their clock drivers). Since the nonlinearities are device-specific, a unique calibration procedure is required for each receiver 10, 30.

Figure 5:
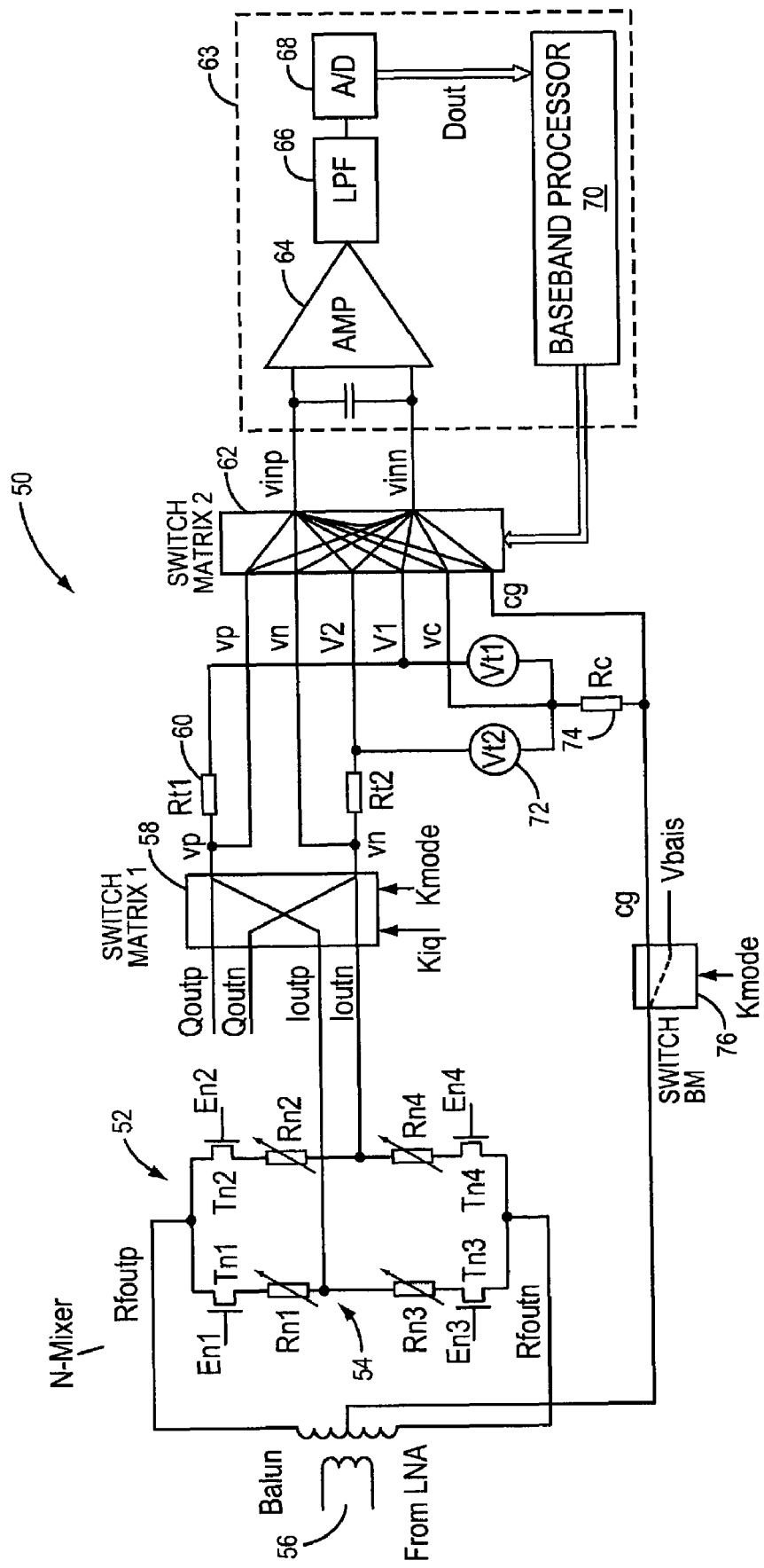
FIG. 5 is a schematic diagram of a calibration circuit for a differential passive mixer core having variable resistive elements in the core, according to one embodiment.

FIG. 5 depicts a differential passive mixer with a calibration circuit 50 according to one embodiment. The circuit 50 includes a balun 56 as a balanced signal source that is connected to the output of an LNA (not shown), one or more differential passive mixer cores 52 including tunable resistor elements 54, a first switching matrix 58, load resistors 60, a second switching matrix 62, and a measuring circuit 63 including a differential amplifier 64, low pass filter 66, analog-to-digital converter 68, and baseband processor 70. The calibration circuit 50 additionally includes voltage sources 72, a common mode resistor 74, and mode switch 76.

The balun 56 generates a balanced source signal from an RF input, and provides a DC ground level via a center tap. For simplicity, FIG. 5 depicts only an I channel mixer 52; however, in a typical implementation, the circuit 50 would include both I and Q mixer cores. The first switching matrix 58 selects between the I channel mixer 52 and Q channel mixer (not shown), in response to the Kiq control signal. The first switching matrix 58 also receives the Kmode control signal, as does the mode switch 76, which switches the circuit 50 between calibration mode and operating mode. In particular, the first switching matrix 58 can connect Ioutp to vp and Ioutn to vn to test the I channel mixer core 52, as depicted; connect Qoutp to vp, and Qoutn to vn for Q mixer (not shown) test; or disconnect all inputs from the outputs during operational mode.

The outputs of the first switching matrix 58 (the outputs of the mixer core 52 under test), the voltages of the load resistors 60, the common voltage and ground are inputs to the second switching matrix 62. The outputs of the second switching matrix 62 are coupled to the inputs of the differential amplifier 64, which measures the voltage difference between its inputs. The differential amplifier 64 is low pass filtered by filter 66, digitized by ADC circuit 68, and analyzed by the baseband processor 70. Voltage sources 72 (Vt1 and Vt2) inject current into the circuit for testing, and the common mode resistor 74 combines currents flowing in the balun.

In calibration mode, a common mode current or differential current is injected into the differential passive mixer core 52 (either I or Q), and the current imbalance created by the mixer 52 imbalance, which is related to the IIP2 performance, is measured by the measuring circuit 63.

The second switching matrix 62 is used to configure the desired test. It can be configured to detect the voltage source imbalance (Vt1 and Vt2), amplifier differential input offset, and also to perform the calibration of the mixer core 52 devices. As the inputs can be swapped, it is feasible for compensation of the error introduced by the measurement circuit 63. This is important as the mismatch current created by the core 52 under test is very weak. Load resistors 60 convert the test voltages (Vt1 and Vt2) into currents, which are correlated to the input impedance of the mixer core 52. Thus it is possible to measure the matching properties of the mixer core 52 by measuring the voltage drops which are proportional to the currents.

In one embodiment, the second switching matrix 62 is operated in a time interleaved fashion, alternately connecting various inputs to the differential amplifier 64 vinp and vinn terminals. The various possible connections are listed in the table below:

TABLE 1

Calibration Test Configurations for Second Switching Module

| Test No. | vinp | vinn |
|---|---|---|
| 1 | vp | vn |
| 2 | vp | V1 |
| 3 | vn | V2 |
| 4 | V1 | vc |
| 5 | V2 | vc |
| 6 | vc | cg |
| 7 | vinn | vinp |
| 8 | vn | Vp |
| 9 | V1 | Vp |
| 10 | V2 | Vn |
| 11 | vc | V1 |
| 12 | vc | V2 |
| 13 | cg | vc |
| 14 | float | float |

Each amplifier 64 input may be connected to one of six inputs, or may be shorted or floated, depending on the test mode. In an embodiment in which two switching matrices 62 and two amplifiers 64 are provided, two pairs of inputs can be detected simultaneously, e.g., Amp1 detects vp and V1, and Amp2 detects vn and V2.

The input DC offset of the amplifier(s) 64 leads to an error in the measurement, and must be calibrated. The mismatch of the amplifier 64 can be calibrated with help of a baseband processor. In the amplifier 64 input DC offset calibration mode, the second switching matrix 62 connects the inputs of the amplifier 64 together, and the amplifier 64 output DC offset is digitized by the ADC 68 and recorded by the baseband processor 70. The output DC offset is then subtracted from measured results when performing the mixer core 52 calibration.

Voltage sources 72 (Vt1 and Vt2) used during the tests have three modes: common mode, differential mode and combined mode. In common mode Vt1=Vt2, and in differential mode Vt1=−Vt2. The voltage sources 72 could be DC, AC or pulse sources. When voltage sources 72 are connected in differential mode and set to AC or pulse sources, the Vt1 and Vt2 are complementary. More generally, the voltage sources 72 can have the combined mode where Vt1=Vcom+e/2 and Vt2=Vcom−e/2, and e is the differential voltage.

In the common mode test, Vt1=Vt2=Vcom(k), k=1, 2, . . . , M, and M is the number of test performed. Each test will take N steps to complete the adjustment of tunable resistor elements 54 Rn1-Rn8, where Rn1-Rn4 are for tuning I-mixer core 52 and Rn5-Rn8 are for the Q-mixer core (not shown).

Normally M is greater than or equal to 2, meaning that the calibration is done at least at two voltage points to guarantee the behavior fitting. The larger M, the more check points are used, and thereby better behavior fitting accuracy, but at the cost of a longer calibration time.

Figure 6:
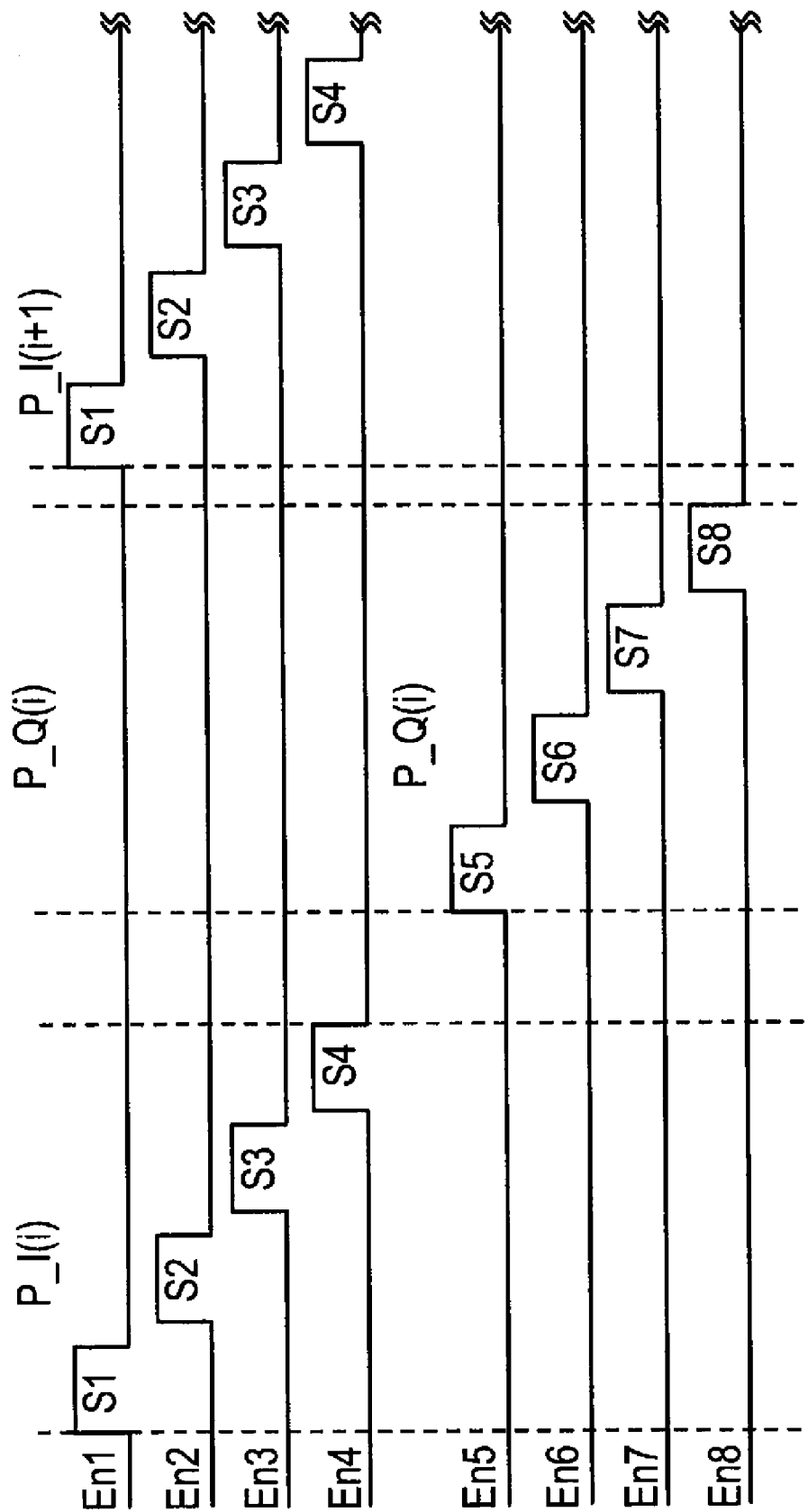
FIG. 6 is a timing diagram of four-phase, non-overlapping clock signals.

In one embodiment, using the calibration circuit 50 of FIG. 5, the mixer 52 branches are connected sequentially, one by one, without overlap in time. FIG. 6 depicts the control signals at nodes En1-En4 for I-mixer in period of P_I(i), and i=1, 2, . . . , N, is the $i^{th}$ step among the N. The common mode test can be done using a voltage source of type DC, AC or pulse, or a combination. However, DC or pulse sources are preferred for simplicity.

The simplest way to calibrate the mixer 52 is to make sure that each branch has the same DC resistance. In this case, the common mode test is used, and the voltage sources 72 are set to DC using Vt1=Vt2=Vdc(k), k=1, 2, . . . , M. For example, during period P_I(i) slot 1 (denoted S1 in FIG. 6), the second switching matrix 62 is configured to connect the amplifier 64 inputs vinp and vinn to vp and V1. Current from the voltage source Vt1 will flow in a loop, including Rc 74, the mode switch 76, Balun, Tn1, Rn1 and Rt1. If only this test is employed, the two sources 72 (Vt1 and Vt2) can be merged together.

Similarly, during period P_I(i) slot 2 (denoted S2 in FIG. 6), the second switching matrix 62 is configured to connect the amplifier inputs vinp and vinn to vn and V2. The current from the voltage source Vt2 will flow in a loop, including Rc 74, the mode switch 76, Balun, Tn2, Rn2 and Rt2.

During the rest of the slots (S3-S8), currents flow similarly through voltage source Vt1 or Vt2, Tn3, Rn3 or Tn4, Rn4 and Rt1 or Rt2. The calculated current ir, r=1, 2, . . . , 8, is recorded when a slot is complete, and based on the results, the tunable resistor elements 54 (Rn1-Rn8) will be adjusted in the next step, i+1, to reduce the current spread. After N steps of tuning, the final minimized mismatch error of the currents, Ef(k), is obtained.

The N step adjustments are repeated M times for different Vdc(k). For production test, if Ef(k) from a mixer core 52 under test is larger than a predetermined threshold, then the core 52 is not qualified and should be removed from the package list. Only cores 52 that pass the test will be packaged.

For a differential passive mixer core 52 that passes the production test and is packaged, a calibration procedure may be required whenever the circuit 50 is activated from a power off, or a standby, or "sleeping" state. In such a test, after N steps of adjustments, the final setting is saved and used during the operating mode, as described above. Calibrations may also be applied once at a power up, or periodically as necessary during operation, to reduce IM2 as desired or required by operating conditions. The calibration results will be stored and used until the next calibration. As an alternative to performing a calibration test every time a mobile device is initialized, it is possible to perform a one-time calibration test at production, and permanently program the tunable resistor elements 16, 54 via fused links.

Figure 7:
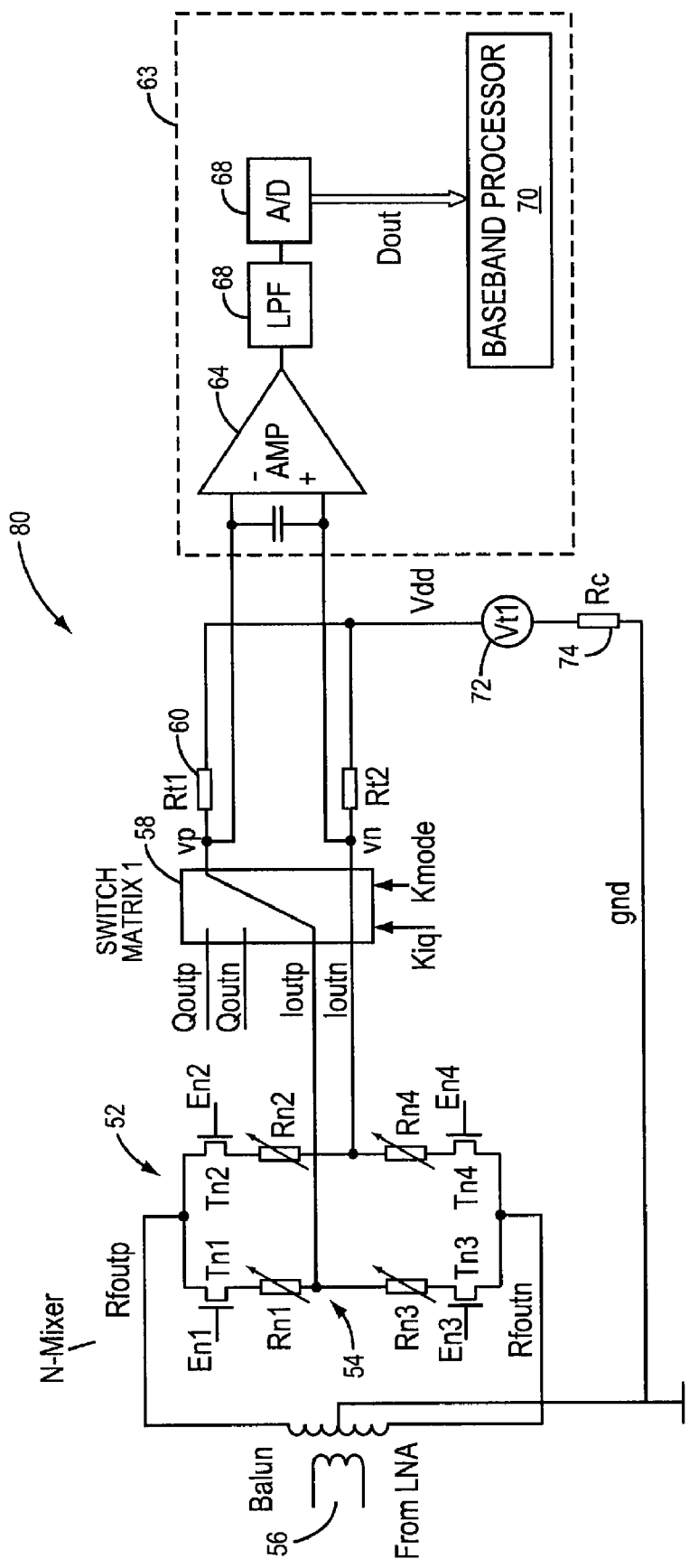
FIG. 7 is a schematic diagram of a calibration circuit for a differential passive mixer core having variable resistive elements in the core, according to another embodiment.
Figure 8:
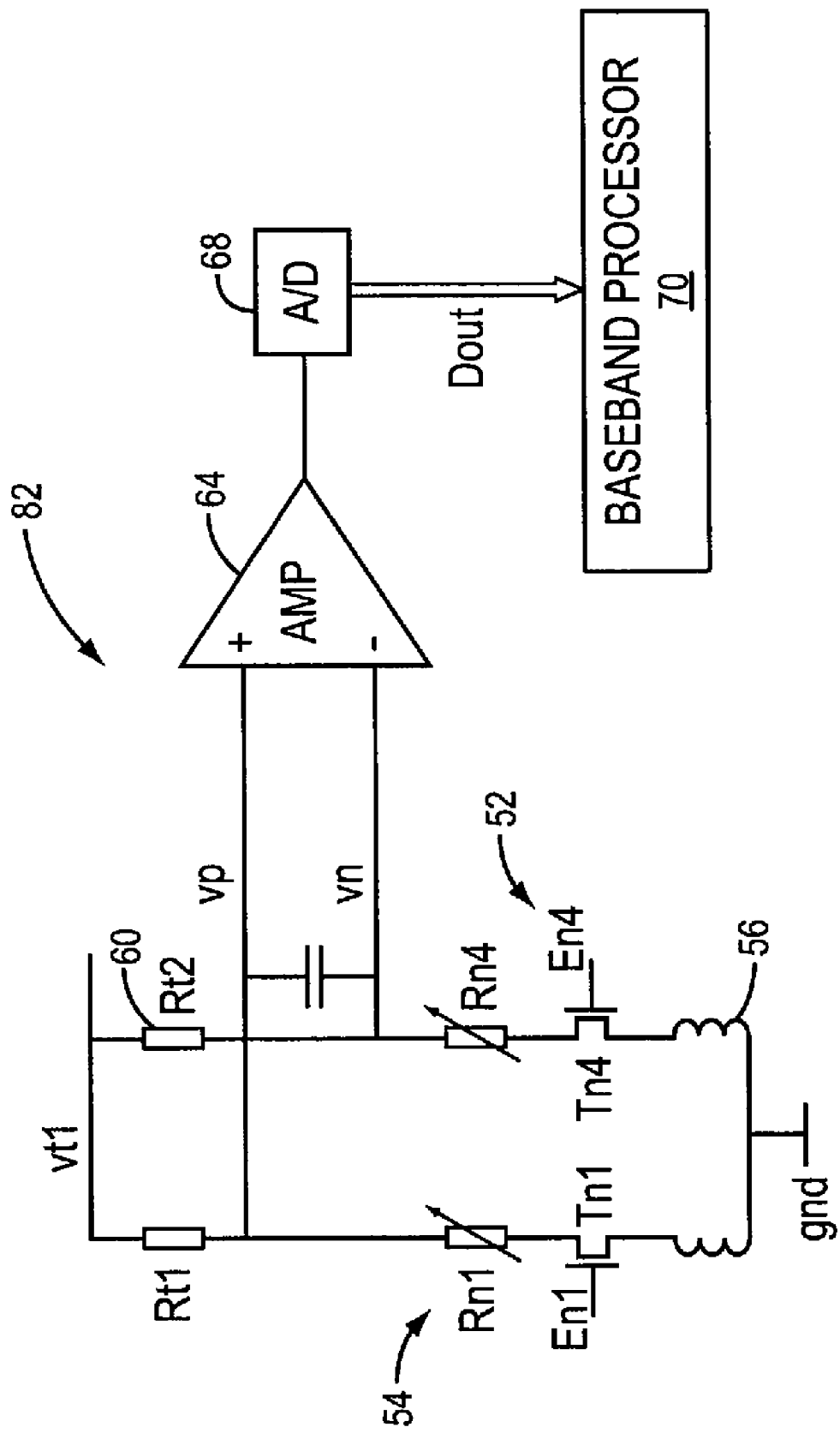
FIG. 8 is a schematic diagram of an equivalent circuit for the calibration circuit of FIG. 7.
Figure 9:
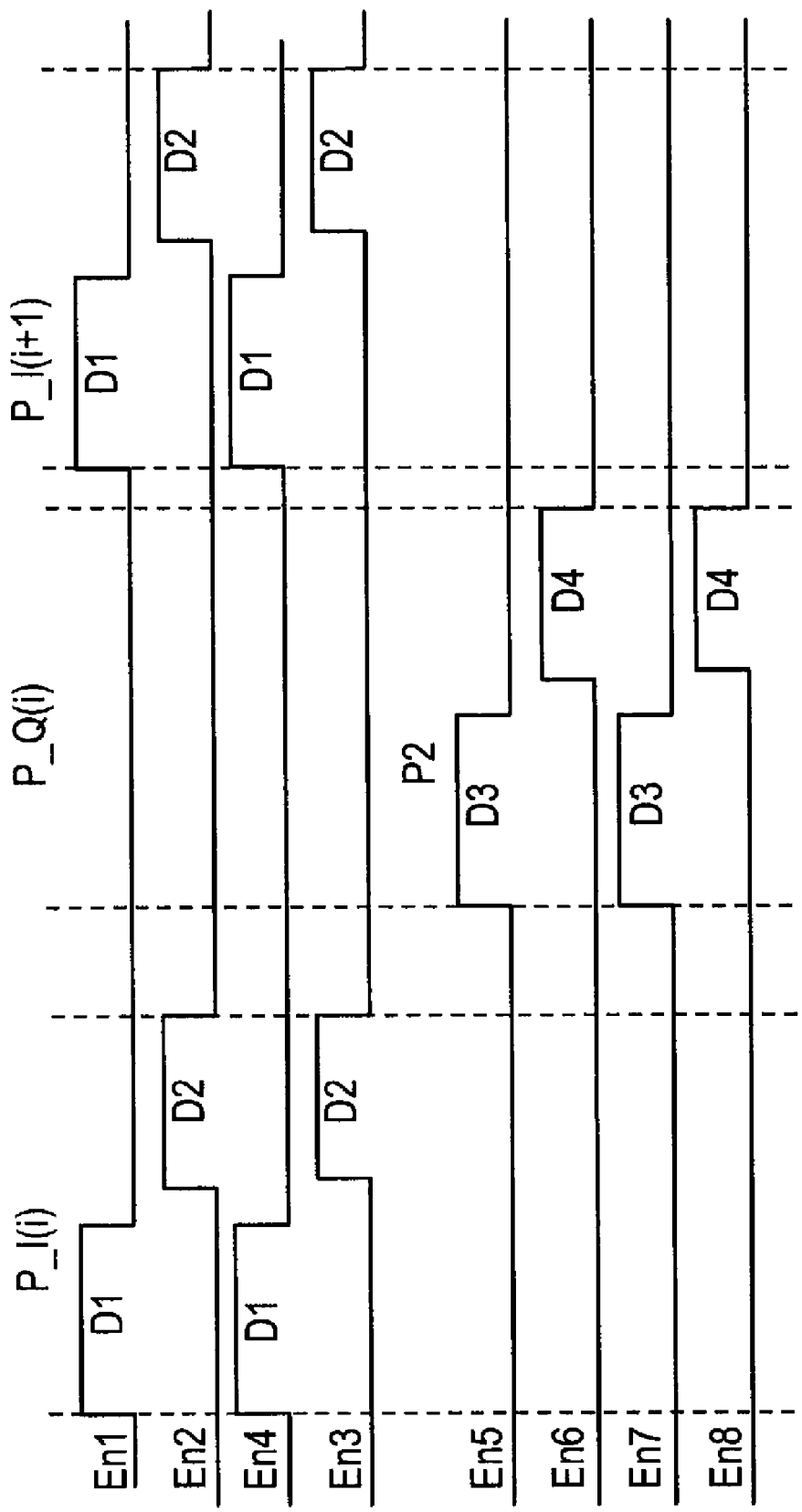
FIG. 9 is a timing diagram of two-phase, non-overlapping clock signals.

FIG. 7 depicts a calibration circuit 80, which is one of the test configurations derived from FIG. 5 by setting Vt1=Vt2 and Vbias=0. FIG. 9 depicts the timing of clock signals applied to the mixer core 52 transistors. In this configuration, and with the clock signals of FIG. 9 applied, the mixer core 52 operates in a topology similar to a differential amplifier. This is illustrated by the equivalent circuit 82 of FIG. 8. As the equivalent circuit 82 shows, the half of the mixer core under test is configured as a differential amplifier, and two branches of the mixer core 52 conduct at same time, and the current imbalance is detected at nodes vp and vn of the differential amplifier 64 in terms of a differential voltage. The tuning procedure is similar to that described above, including N steps, of which the $i^{th}$ is depicted in FIG. 9. It is possible to chop the amplifier 64 so that the DC offset of the amplifier 64 itself can be removed from the test results. By properly setting the conducting voltage at the gates En1-En8, the mismatch between two transistor devices can be easily detected, and the tunable resistor elements 54 are adjusted to minimize or eliminate it.

Figure 10:
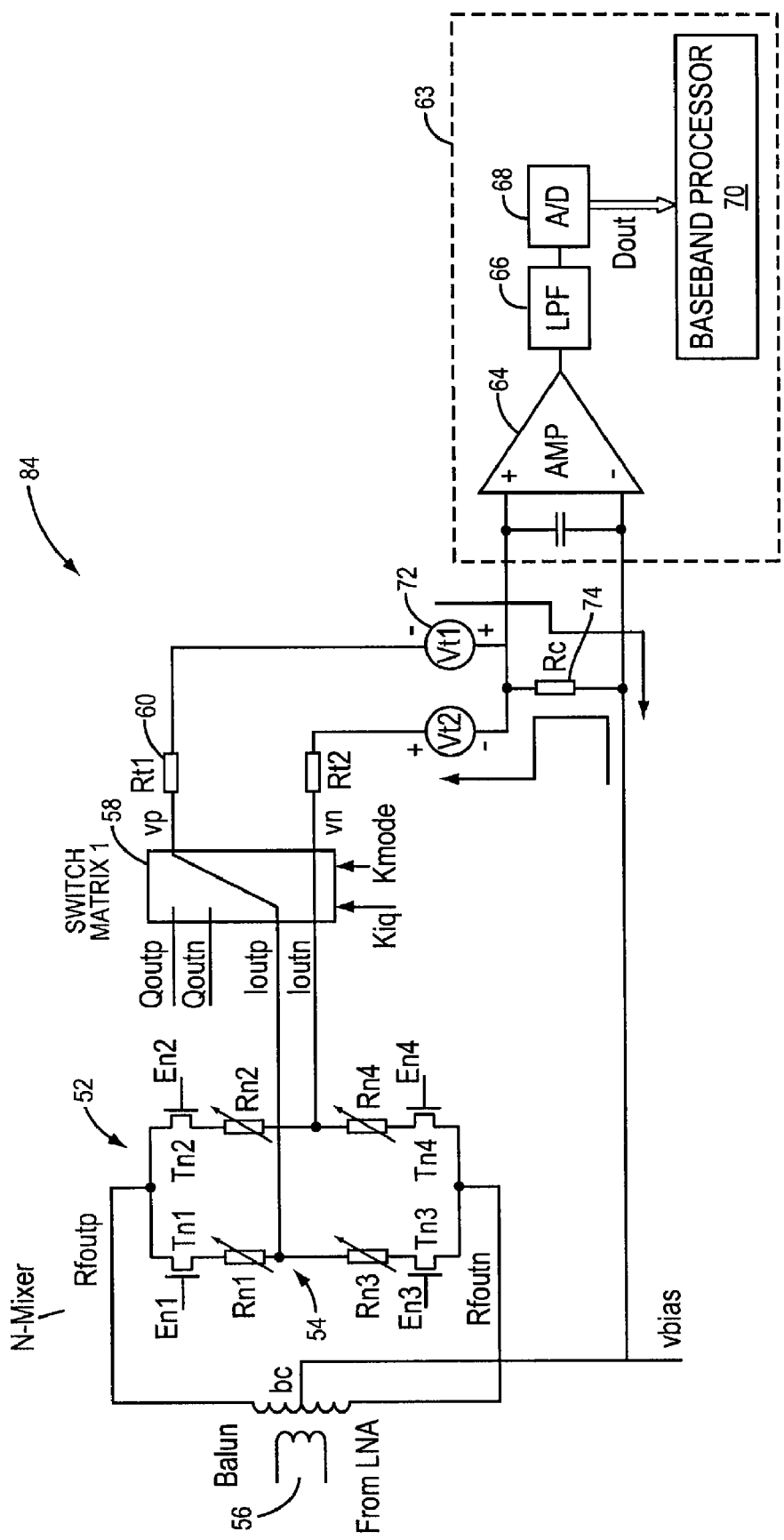
FIG. 10 is a schematic diagram of a calibration circuit for a differential passive mixer core having variable resistive elements in the core, according to another embodiment.
Figure 11:
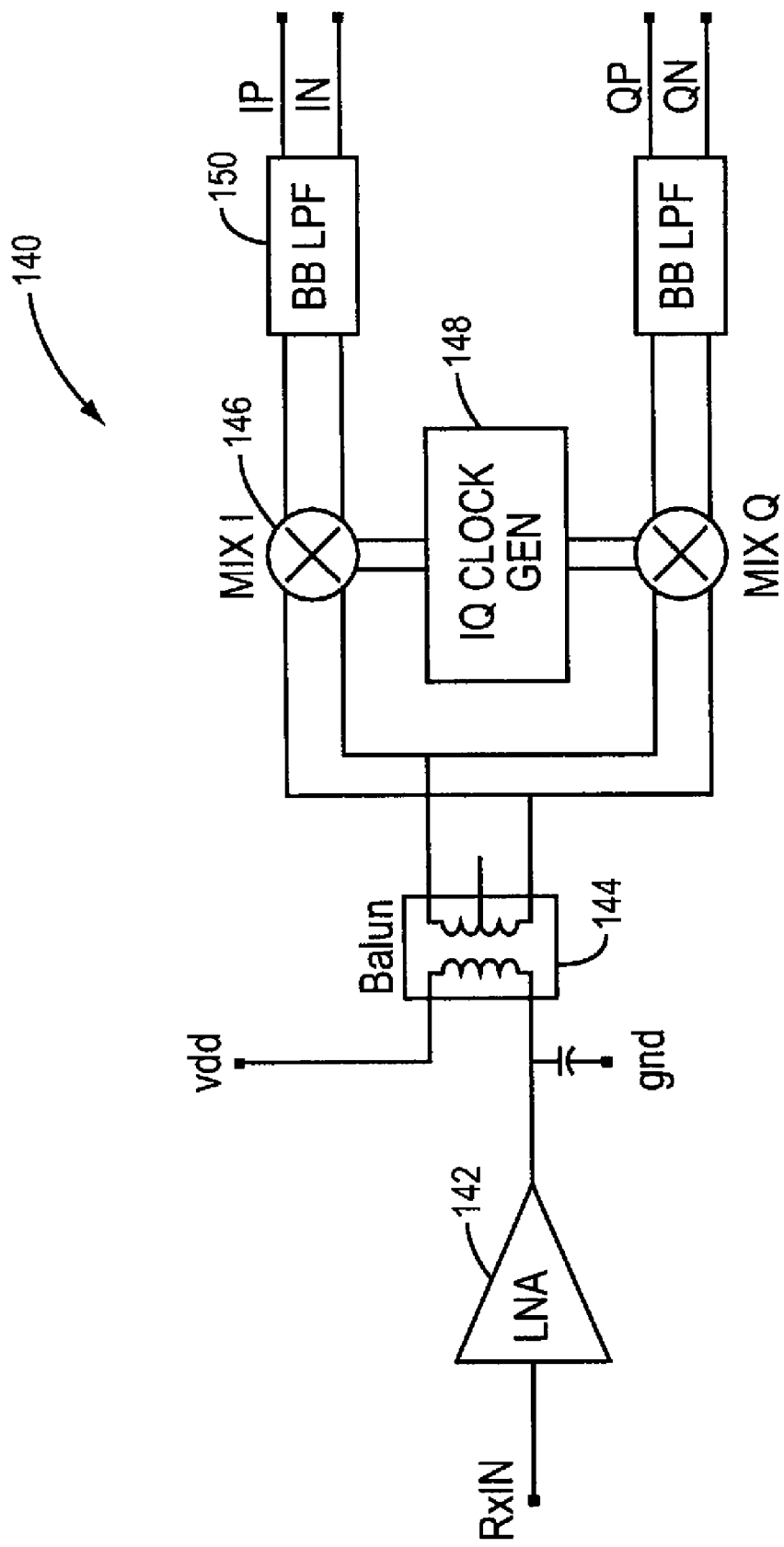
FIG. 11 is a schematic diagram of a prior art RF receiver circuit.

FIG. 10 depicts a calibration circuit 84, which is another test configuration derived from FIG. 5 by setting Vt1=−Vt2. As shown in the circuit 84, a differential voltage mode is used, where Vt1=−Vt2, and the timing relation shown in FIG. 9 is used for the transistor gate control. The current flowing through Vt2 is opposite to the current flowing through Vt1. Thus, in the common mode resistor 74, the matched current component will be subtracted and only the differential component Vd remains. If Vt1 and Vt2 are pulse sources, their polarities can be swapped. Then the differential voltage Vd can be measured as Vdp and Vdn at two opposite polarities of Vt1 and Vt2. The difference between Vdp and Vdn is the imbalance part created by the device mismatch, and the tunable resistor elements 54 are adjusted to eliminate the imbalance.

By tuning the output loads of a passive differential mixer, the second-order differential distortion that gives rise to second-order intermodulation is minimized. A calibration procedure adjusts tunable resistor elements in the mixer core or load to minimize the imbalance. By reducing the second-order intermodulation, passive differential mixers can be more economically implemented in direct conversion receivers with small device sizes, yielding high linearity, low noise figures, small silicon footprint, and low power consumption.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A method of reducing second order intermodulation in a differential passive mixer having a mixer core including differentially-connected transistors, a load, and a calibration circuit having a signal source, the transistors driven by a clock driver, the method comprising:
    providing one or more tunable resistive elements in the mixer core; and
    in a calibration procedure that compensates for a mismatch in properties between transistors in the differential mixer or clock driver,
        in each of a plurality of steps, injecting a calibration current through one or more, but less than all, of the tunable resistive elements in the mixer core;
        at each step, measuring a resulting voltage or current;
        comparing the voltages or currents from two or more steps; and
        adjusting the resistance of one or more tunable resistive elements to reduce the measured voltage or current spread.

2. The method of claim 1 wherein adjusting the resistance of one or more tunable resistive elements comprises selectively switching resistive elements into a parallel configuration with a nominal resistive element to alter the effective resistance of the nominal resistor element.

3. The method of claim 1 wherein the calibration procedure adjusts one or more resistive elements to compensate for variations between the differentially-connected transistors, minimizing even order distortion in the differential passive mixer.

4. The method of claim 3 wherein a tunable resistive element is provided between each differentially-connected transistor and an output of the mixer core.

5. The method of claim 4 wherein injecting a calibration current through one or more, but less than all, of the tunable resistive elements in the mixer core comprises enabling one transistor at a time and injecting current through the enabled transistor and an associated tunable resistor element.

6. The method of claim 5 wherein enabling one transistor at a time comprises driving the transistors with separate, non-overlapping enable signals.

7. The method of claim 1 wherein the differential passive mixer includes complementary passive mixer cores, each including tunable resistive elements in the core.

8. The method of claim 1 wherein the calibration procedure is performed at the differential passive mixer manufacture, or when the differential passive mixer is activated from a power off or a standby state.

9. The method of claim 1 wherein injecting a calibration current through one or more, but less than all, of the tunable resistive elements in the mixer core comprises
    enabling one pair of transistors in the differential passive mixer at a time; and
    injecting a common mode current or differential current from the signal source to the enabled pair of transistors and associated tunable resistor elements;
    wherein measuring a resulting voltage or current comprises measuring a current or voltage imbalance between each pair of transistors.

10. The method of claim 9 wherein measuring a current or voltage imbalance comprises:
    comparing voltages in a differential amplifier;
    digitizing the differential amplifier output; and
    processing the differential amplifier output in a baseband processor.

11. The method of claim 1 wherein the calibration procedure further comprises measuring the input DC offset of an amplifier in a measuring circuit, and removing the offset from measurements of mixer device properties.

12. A differential passive mixer with reduced second order intermodulation, comprising:
    one or more mixer cores, each including differentially-connected transistors and tunable resistive elements; and
    a calibration circuit, comprising:
        at least one signal source;
        a first switching matrix operative to set the mixer cores in calibration mode or operation mode;
        a second switching matrix operative to selectively couple outputs of a selected mixer core to a measuring circuit during the calibration mode; and wherein
        the measuring circuit having two inputs, and operative to detect and quantify a current or voltage mismatch in signals coupled to the inputs.

13. The differential passive mixer of claim 12 wherein a mode signal is operative to enable the switching matrices and measuring circuit in a calibration mode, and disable the switching matrices and measuring circuit in an operating mode.

14. The differential passive mixer of claim 12 wherein the second switching matrix is operative to selectively couple outputs of the signal sources to the measuring circuit to detect the signal source imbalance.

15. The differential passive mixer of claim 12 wherein the second switching matrix is operative to couple the two inputs of the measuring circuit together to calibrate DC offset of the two inputs.

16. The differential passive mixer of claim 12 wherein the measuring circuit comprises:
- a differential amplifier comparing voltages coupled to the inputs of the measuring circuit;
- an analog to digital converter circuit operative to digitize the output of the differential amplifier; and
- a baseband processor operative to process the digitized output.

17. The differential passive mixer of claim 12 wherein the measuring circuit further comprising a low pass filter operative to remove high frequency components from the differential amplifier output prior to digitizing the output.

* * * * *

UNITED STATES PATENT AND TRADEMARK OFFICE
CERTIFICATE OF CORRECTION

PATENT NO. : 8,204,467 B2  Page 1 of 1
APPLICATION NO. : 12/368785
DATED : June 19, 2012
INVENTOR(S) : Tillman et al.

It is certified that error appears in the above-identified patent and that said Letters Patent is hereby corrected as shown below:

In Fig. 7, Sheet 5 of 9, delete " 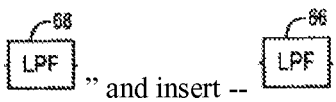 " and insert --  --, therefor.

In Fig. 9, Sheet 7 of 9, delete "  " and insert --  --, therefor.

In Fig. 9, Sheet 7 of 9, delete "  " and insert --  --, therefor.

In Column 3, Line 44, delete "Rb<<R1a," and insert -- R1b<<R1a, --, therefor.

In Column 4, Line 2, delete "(and or" and insert -- (and/or --, therefor.

In Column 4, Line 2, delete "(and or" and insert -- (and/or --, therefor.

Signed and Sealed this
Ninth Day of April, 2013

Teresa Stanek Rea
*Acting Director of the United States Patent and Trademark Office*